United States Patent
Carney

(10) Patent No.: US 9,385,041 B2
(45) Date of Patent: Jul. 5, 2016

(54) METHOD FOR INSULATING SINGULATED ELECTRONIC DIE

(71) Applicant: Semiconductor Components Industries, LLC, Phoenix, AZ (US)

(72) Inventor: Francis J. Carney, Mesa, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 14/469,478

(22) Filed: Aug. 26, 2014

(65) Prior Publication Data

US 2016/0064282 A1     Mar. 3, 2016

(51) Int. Cl.
*H01L 21/78* (2006.01)
*H01L 25/00* (2006.01)
*H01L 23/498* (2006.01)

(52) U.S. Cl.
CPC .......... *H01L 21/78* (2013.01); *H01L 23/49811* (2013.01); *H01L 25/50* (2013.01)

(58) Field of Classification Search
None
See application file for complete search history.

(56) References Cited

U.S. PATENT DOCUMENTS

| | | |
|---|---|---|
| 4,820,377 A | 4/1989 | Davis et al. |
| 5,075,253 A | 12/1991 | Sliwa, Jr. |
| 5,166,097 A | 11/1992 | Tanielian |
| 5,510,655 A | 4/1996 | Tanielian |
| 5,753,418 A | 5/1998 | Tsai et al. |
| 5,856,705 A | 1/1999 | Ting |
| 5,863,813 A | 1/1999 | Dando |
| 6,030,885 A | 2/2000 | Bothra |
| 6,140,151 A | 10/2000 | Akram |
| 6,165,814 A | 12/2000 | Wark et al. |
| 6,200,851 B1 | 3/2001 | Arnold |
| 6,214,703 B1 | 4/2001 | Chen et al. |
| 6,342,724 B1 | 1/2002 | Wark et al. |
| 6,563,204 B1 | 5/2003 | Glenn |
| 6,642,127 B2 | 11/2003 | Kumar et al. |
| 6,686,225 B2 | 2/2004 | Wachtler |
| 6,897,128 B2 | 5/2005 | Arita |
| 6,969,669 B2 | 11/2005 | Arita |
| 7,060,531 B2 | 6/2006 | Arita |
| 7,098,077 B2 | 8/2006 | Huang et al. |
| 7,129,114 B2 | 10/2006 | Akram |
| 7,253,477 B2 | 8/2007 | Loechelt et al. |

(Continued)

FOREIGN PATENT DOCUMENTS

| | | |
|---|---|---|
| WO | WO 01/56063 A2 | 8/2001 |
| WO | 2004066382 A1 | 8/2004 |

(Continued)

OTHER PUBLICATIONS

On Semiconductor, AND8464/D, Board Level Application Note for 0402, 0502 and 0603 DSN2 Packages, http://onsemi.com.

*Primary Examiner* — Mohammad Islam
*Assistant Examiner* — Mikka Liu
(74) *Attorney, Agent, or Firm* — Kevin B. Jackson

(57) ABSTRACT

In one embodiment, a method of forming an electronic device includes providing a wafer having plurality of die separated by spaces. The method includes plasma singulating the wafer through the spaces to form singulation lines that expose side surfaces of the plurality of die. The method includes forming an insulating layer on the exposed side surfaces. In one embodiment, the steps of singulating and forming the insulating layer are carried out with the wafer mounted to a carrier substrate that supports the wafer and singulated die during both steps.

20 Claims, 6 Drawing Sheets

(56) References Cited

U.S. PATENT DOCUMENTS

| | | |
|---|---|---|
| 7,309,623 B2 | 12/2007 | Tan et al. |
| 7,335,576 B2 | 2/2008 | David et al. |
| 7,488,668 B2 | 2/2009 | Arita et al. |
| 7,629,228 B2 | 12/2009 | Haji et al. |
| 7,651,925 B2 | 1/2010 | Wyant |
| 7,678,670 B2 | 3/2010 | Arita et al. |
| 7,705,420 B2 | 4/2010 | Joodaki |
| 7,767,551 B2 | 8/2010 | Arita et al. |
| 7,846,848 B2 | 12/2010 | Lewington et al. |
| 7,883,343 B1 | 2/2011 | Mulligan et al. |
| 7,906,410 B2 | 3/2011 | Arita et al. |
| 8,178,372 B2 | 5/2012 | Lutgen et al. |
| 8,664,089 B1 | 3/2014 | Burghout et al. |
| 8,691,702 B2 | 4/2014 | Geerpuram et al. |
| 8,778,806 B2 | 7/2014 | Johnson et al. |
| 8,785,332 B2 | 7/2014 | Johnson et al. |
| 8,796,154 B2 | 8/2014 | Johnson et al. |
| 8,802,545 B2 | 8/2014 | Johnson et al. |
| 2003/0207579 A1 | 11/2003 | Rattner et al. |
| 2004/0087065 A1 | 5/2004 | Udrea et al. |
| 2004/0102025 A1 | 5/2004 | Arita |
| 2004/0185580 A1 | 9/2004 | Goh |
| 2005/0084996 A1 | 4/2005 | Harper |
| 2005/0104165 A1 | 5/2005 | Ishio et al. |
| 2005/0142863 A1 | 6/2005 | Spandre |
| 2006/0001130 A1 | 1/2006 | Islam et al. |
| 2006/0030078 A1 | 2/2006 | Jiang et al. |
| 2006/0118515 A1 | 6/2006 | Dolechek et al. |
| 2006/0154401 A1 | 7/2006 | Gardner et al. |
| 2006/0189144 A1* | 8/2006 | Krawczyk ........... B81C 1/00531 438/710 |
| 2006/0244096 A1 | 11/2006 | Sekiya |
| 2006/0278956 A1 | 12/2006 | Cadouri |
| 2007/0087524 A1 | 4/2007 | Montgomery |
| 2007/0132034 A1 | 6/2007 | Curello et al. |
| 2007/0148807 A1 | 6/2007 | Akram |
| 2007/0249178 A1 | 10/2007 | Ogihara |
| 2008/0099900 A1 | 5/2008 | Oganesian et al. |
| 2009/0001609 A1 | 1/2009 | Lim |
| 2009/0057838 A1 | 3/2009 | Arita et al. |
| 2009/0065904 A1 | 3/2009 | Wang |
| 2009/0263927 A1 | 10/2009 | Lin et al. |
| 2010/0048001 A1 | 2/2010 | Harikai et al. |
| 2010/0055875 A1 | 3/2010 | Haji et al. |
| 2010/0173474 A1 | 7/2010 | Arita et al. |
| 2010/0323469 A1* | 12/2010 | Borthakur ......... H01L 21/76898 438/65 |
| 2013/0230969 A1 | 9/2013 | Martinez et al. |
| 2013/0230970 A1* | 9/2013 | Martinez ............. H01L 21/3065 438/460 |
| 2013/0230973 A1 | 9/2013 | Gauldin et al. |
| 2013/0230974 A1 | 9/2013 | Martinez et al. |
| 2013/0344683 A1 | 12/2013 | Lazerand et al. |
| 2015/0115448 A1* | 4/2015 | Maier .................. H01L 21/306 257/751 |

FOREIGN PATENT DOCUMENTS

| | | |
|---|---|---|
| WO | WO2004/066382 | 8/2004 |
| WO | 2007007883 A1 | 1/2007 |
| WO | PCT/JP2007/066960 | 8/2007 |
| WO | 2008081968 A1 | 7/2008 |
| WO | 200963620 A1 | 5/2009 |

\* cited by examiner

METHOD FOR INSULATING SINGULATED ELECTRONIC DIE

CROSS REFERENCE TO RELATED APPLICATION

Not Applicable

BACKGROUND

The present invention relates, in general, to electronics and, more particularly, to structures and methods of forming semiconductor devices.

In a push to achieve smaller electronic products, manufacturers have sought ways to reduce the size of packaged electronic components. In some applications, chip level packages have been implemented where bare semiconductor die are placed directly onto a next level of assembly, such as printed circuit board. Such semiconductor die can be very small, with some being less than 1.7 millimeters (mm) by 0.8 mm.

In chip level packages, an electrical shorting problem has often occurred when the conductive material used to attach the die to the printed circuit board makes unwanted contact to side surfaces of the die being attached to the board or makes unwanted contact to adjoining devices that are placed closed by. In the past, the semiconductor industry utilized various methods to isolate edge surfaces of electronic devices to make these surfaces less susceptible to electrical shorting problems. Such methods have included deep diffusion isolations, deep trench isolations, and mesa-etched isolations as well as others. One common problem with these prior approaches is they take up significant active area on the electronic die. This adds to the overall die cost because larger die sizes are required to accommodate the isolation structures. Also, some of the prior methods require multiple photolithographic process steps and multiple thermal process steps to form the isolation structures, which adds manufacturing time and costs. Additionally, some of the prior approaches do not provide adequate isolation particularly on very small die.

Accordingly, it is desirable to have a structure and method of insulating singulated die from a semiconductor wafer that does not consume electronic die active area and that does not require expensive or additional processing steps.

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

Plasma dicing is a promising process compared to mechanical or laser scribing, sawing, and other alternative processes used to singulate electronic die. For example, the plasma dicing process supports narrower scribe lines, has increased throughput, and can singulate die in varied and flexible patterns. Techniques for plasma dicing are described, for example, in U.S. Pat. No. 7,781,310 issued on Aug. 24, 2010 and U.S. Pat. No. 7,985,661, issued on Jul. 26, 2011, which are hereby incorporated by reference.

In general, the present embodiments relate to a method of forming an isolating layer or insulating layer along side surfaces of the singulated electronic die. In some embodiments, plasma dicing is used to singulate the electronic die. In some embodiments, the insulating layer is formed while the wafer is attached to a substrate, such as an adhesive substrate. In some embodiments, the insulating layer has a composition and thickness that provides protection against the electrical shorting problem described previously with related devices, including, but not limited to, chip level devices. In other embodiments, the insulating layer can be formed in the same apparatus that is used for the singulation step. In another embodiment, the insulating layer can be formed in a different apparatus than the apparatus used for the singulation step. In other embodiments, the method is configured to reduce or minimize the formation of the insulating layer on the active surface of the singulated die to facilitate electrical connections to the singulated die in subsequent processing. In some embodiments, the insulating layer comprises an organic material. In other embodiments, the insulating layer comprises an inorganic material.

Figure 1:
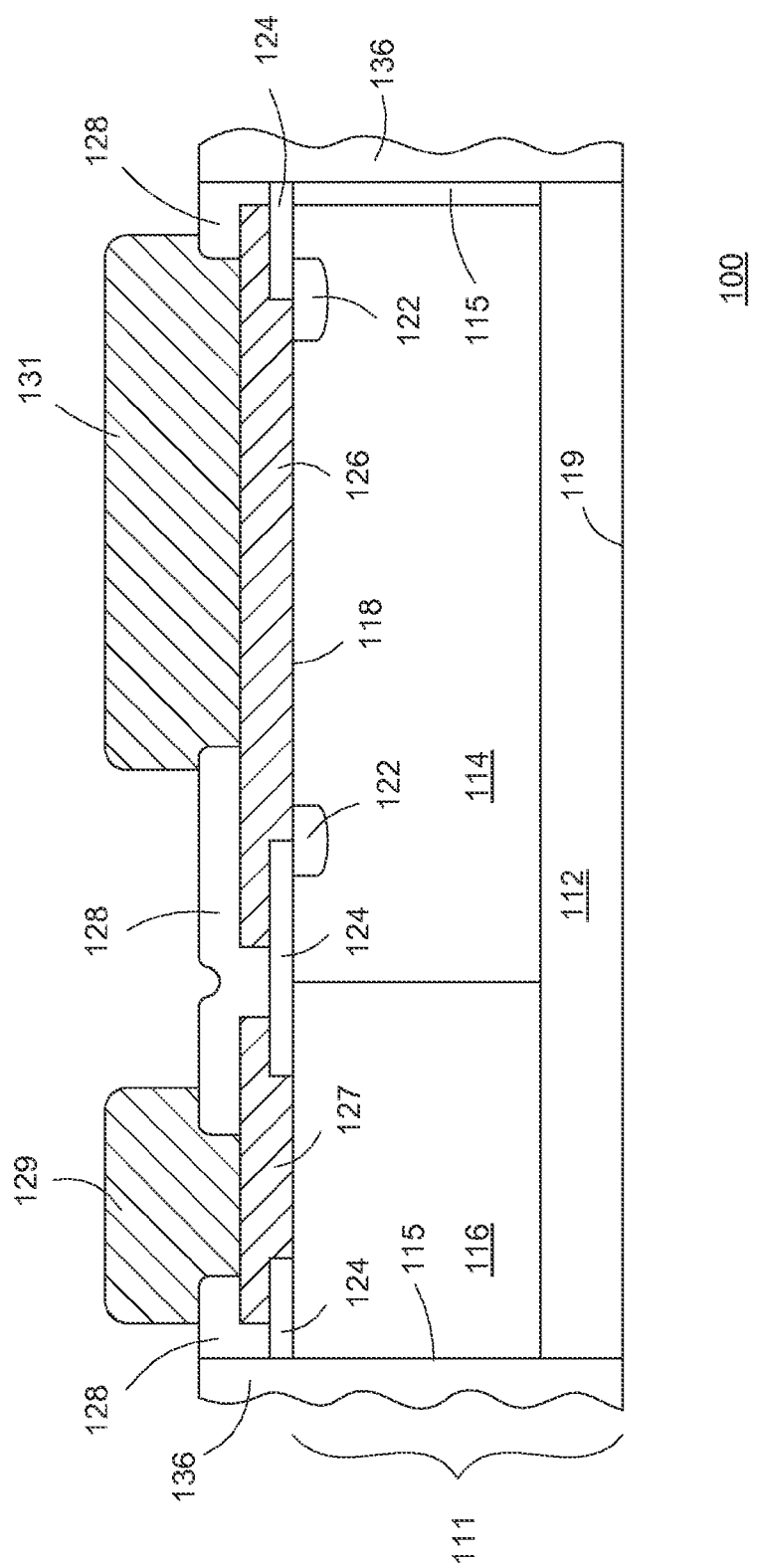
FIG. 1 illustrates a cross-sectional view of a semiconductor die processed in accordance with an embodiment of the present invention.

FIG. 1 illustrates an enlarged cross-sectional view of an electronic device 100, for example, a semiconductor device 100, which has been fabricated in accordance with a first embodiment. For purposes of illustration only, device 100 is shown as a Schottky diode device configured for chip level packaging. In some embodiments, device 100 is referred to as a dual silicon no-lead ("DSN") type device. In some embodiments, device 100 has a very small size or footprint. For example, in some embodiments, device 100 has a length less than about 1.6 mm and a width less than about 0.8 mm. In other embodiments, device 100 has a length less than about 1.4 mm and a width less than about 0.6 mm. In still further embodiments, device 100 has a length less than 1.0 mm and a width less than about 0.6 mm. In some embodiments, dimensions such as the foregoing present particular challenges because such very small devices are susceptible to electrically shorting problems particularly along the side surfaces thereof that can result after subsequent assembly steps. However, it is understood that the present embodiment is not limited to such small dimensions and is applicable to larger die as well. The present embodiment is also applicable to other types of electronic devices, such as active devices (integrated circuits, discrete devices, optical devices, sensor devices, etc.) and/or passive devices particularly where device active area is not available for other isolation techniques, such as diffusion isolation techniques where such techniques are cost prohibitive or do not provide adequate isolation.

In the present embodiment, device 100 includes a region of semiconductor material 111 or semiconductor region 111. Region of semiconductor material 111 can include a semiconductor substrate 112 and semiconductor layer 114. In one embodiment, semiconductor substrate 112 can be n-type and can be doped with, for example, phosphorous, arsenic or antimony. In one embodiment, semiconductor layer 114 can be an n-type layer formed using epitaxial growth techniques. In other embodiments, semiconductor layer 114 can be formed by doping and diffusion techniques. Semiconductor layer 114 typically has a lower dopant concentration than semiconductor substrate 112. Region of semiconductor material 111 includes a first major surface 118 and an opposing second major surface 119.

Device 100 further includes a doped sinker region 116 formed in a portion of semiconductor layer 114 extending toward substrate 112. In one embodiment, doped sinker region 116 is an n-type doped region and has a higher dopant concentration than semiconductor layer 114. In one embodiment, doped sinker region 116 is doped with phosphorous and is formed using, for example, ion implantation and diffusion techniques. Doped sinker region 116 is configured as a current carrying region of device 100. In one embodiment, doped sinker region 116 is configured as a cathode region. Device 100 further includes a doped guard ring region 122 adjacent to major surface 118 within semiconductor layer 114. In one embodiment, doped guard ring region 122 is a p-type doped region and can be formed using, for example, boron ion implantation and anneal techniques.

A dielectric region 124 is formed on major surface 118 and includes openings to provide a contact region to portions of semiconductor layer 114 and to doped sinker region 116. In one embodiment, dielectric region 124 can be an oxide material. For example, in one embodiment dielectric region 124 can be a thermal oxide, a deposited oxide, or combinations of both. A conductive layer 126 is formed overlying semiconductor layer 114 including portions of doped guard ring region 122. A conductive layer 127 is formed overlying doped sinker region 116. In one embodiment, conductive layer 126 and conductive layer 127 can be titanium-tungsten, nickel-vanadium, aluminum metal layer. A dielectric layer 128 can be formed on portions of conductive layers 126 and 127 and portions of dielectric layers 124 as generally illustrated in FIG. 1. In one embodiment, dielectric layer 128 can be silicon nitride.

Device 100 further includes a conductive bump 129 placed adjacent to conductive layer 127 and a conductive bump 131 placed adjacent to conductive layer 126. In one embodiment, conductive bumps 129 and 131 can be electroplated bumps. In other embodiments, conductive bumps 129 and 131 can be formed using electroless plating techniques.

In accordance with the present embodiment, one or more isolating layer(s) or insulating layer(s) 136 are formed along side or sidewall surfaces 115 of device 100. In a preferred embodiment as will be described in more detail later, insulating layers 136 are formed after device 100 is singulated from a semiconductor wafer using plasma dicing techniques. In one embodiment, the same apparatus that is used to plasma singulate device 100 is used to form insulating layers 136. In another embodiment, a different apparatus is used to form insulating layers 136. In one preferred embodiment, insulating layers 136 are formed to include polymer material formed during the singulation process. More specifically, instead of removing the polymer material, the polymer material generated during and/or after the singulation process is left in place and, in some embodiments additional insulating material is added to the polymer material to increase the overall thickness of insulating layers 136. In other embodiments, the polymer material generated during the singulation process is removed and insulating layers 136 are formed at the end of the process using a process chemistry that is different than the process chemistry used to singulate the wafer into individual die.

In one embodiment, insulating layers 136 include an organic material, such as a polymer material. In one embodiment, insulating layers 136 comprise a fluorocarbon polymer. In other embodiment, insulating layers 136 comprise polymers formed from carbon and hydrogen combined with other halogens such as chlorine and bromine or formed from just carbon and hydrogen or carbon, hydrogen and oxygen without halogens present. In other embodiments, insulating layers 136 can include an inorganic material such as a silicon oxide material. In one embodiment, insulating layers 136 can be more than one insulating layers comprising a different material.

In accordance with the present embodiment, insulating layers 136 are formed on sidewalls 115 of device 100 as well as over the upper structures on device 100 adjacent to major surface 118. In one embodiment, after insulating layers 136 are formed, a directional etch or anisotropic etch can be used to remove insulating layers 136 from over the upper structures on device 100, or at least reduce the thickness such that the upper structures can bond effectively to a next level of assembly.

In one embodiment, insulating layer 136 has a thickness greater than about 0.1 microns. In another embodiment, insulating layer 136 has a thickness greater than about 0.3 microns. In another embodiment, insulating layer 136 has a thickness greater than about 0.5 microns. In a further embodiment, insulating layer 136 has a thickness greater than about 0.7 microns. In one embodiment, insulating layer 136 has a thickness less than about 1 micron. In a further embodiment, insulating layer 136 has a thickness between about 0.1 micron and about 0.5 micron. In another embodiment, insulating layer 136 has a thickness between about 0.3 microns as about 0.7 microns. In another embodiment, insulating layer 136 has a thickness between about 0.5 microns and about 1 micron.

Figure 2:
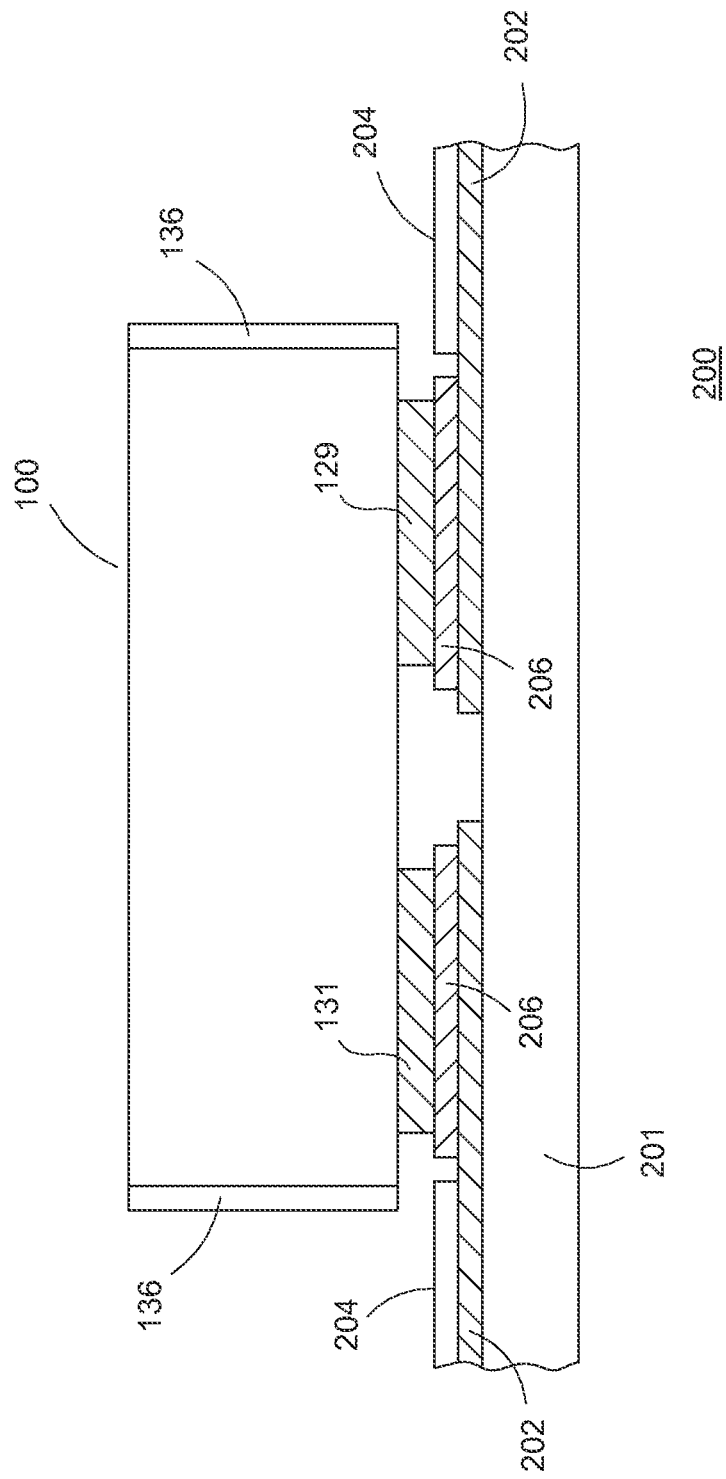
FIG. 2 illustrates a cross-sectional view of the semiconductor die of FIG. 1 attached to a next level of assembly in accordance with an embodiment of the present invention.

FIG. 2 illustrates a partial cross-sectional view of an assembly 200 including device 100 attached to a next level of assembly, such as a printed circuit board 201. Printed circuit board 201 includes conductive traces and/or pads 202 on a major surface. Solder mask layers 204 can be used to protect portions of conductive traces 202. Conductive bumps 129 and 131 on device 100 can be attached to conductive traces 202 using solder layers 206. In accordance with the present embodiment, insulating layers 136 on device 100 are configured to protect device 100 from electrical shorting problems associated with solder layers 206 used to attach device 100 to printed circuit board 201, or associated with solder layers used to attach adjacent devices to printed circuit board 201.

Figure 3:
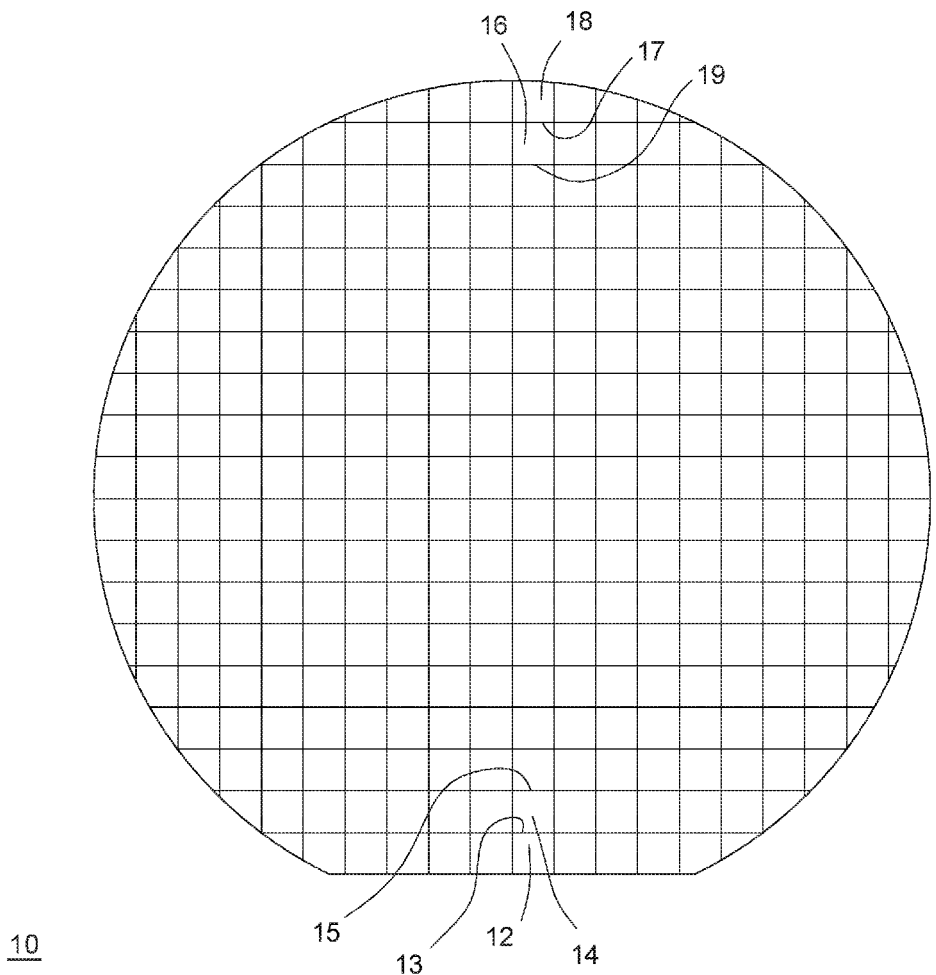
FIG. 3 illustrates a reduced plan view of an embodiment of a wafer in accordance with the present invention.

FIG. 3 is a reduced plan view that graphically illustrates a wafer 10 at a step in fabrication. In one embodiment, wafer 10 can be a semiconductor substrate. Wafer 10 includes a plurality of electronic die, such as semiconductor die 12, 14, 16, and 18, that are formed on or as part of semiconductor wafer 10. Die 12, 14, 16, and 18 are spaced apart from each other on wafer 10 by spaces in which singulation lines are to be formed or defined, such as scribe lines or singulation lines 13, 15, 17, and 19. In the present embodiments, the semiconductor die on wafer 10 generally are separated from each other on all sides by areas where scribe lines or singulation lines, such as singulation lines 13, 15, 17, and 19 are to be formed. Die 12, 14, 16, and 18 can be any kind of electronic device including semiconductor devices such as, diodes, transistors, discrete devices, sensor devices, optical devices, integrated circuits, passive devices, or other devices known to one of ordinary skill in the art. In one embodiment, die 12, 14, 16, and 18 can be a plurality of devices 100, but are depicted as general semiconductor devices for ease of illustration.

Figure 4:
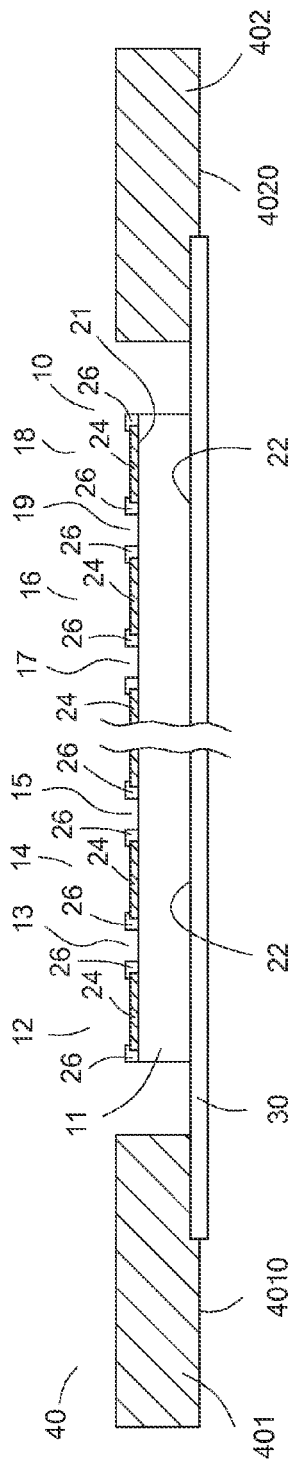
FIGS. 4-6 illustrate partial cross-sectional views of an embodiment of the wafer of FIG. 3 at various stages in a process of singulating die from the wafer in accordance with an embodiment of the present invention.

FIG. 4 illustrates an enlarged cross-sectional view of wafer 10 at an early step in a die plasma singulation method in accordance with a first embodiment. In one embodiment, wafer 10 is attached to a carrier substrate, transfer tape, or carrier tape 30 that facilitates supporting the plurality of die after they are singulated. In accordance with the present embodiment, carrier tape 30 further supports the plurality of die during the formation of one or more insulating layers on sidewall surfaces of the singulated die. Such carrier tapes are well known to those of skill in the art. In one embodiment, carrier tape 30 can be attached to a frame 40, which can include frame portions or portions 401 and 402. As illustrated, carrier tape 30 can be attached to surface 4010 of frame portion 401 and to surface 4020 of frame portion 402.

In the cross-section illustrated, wafer 10 can include a bulk substrate 11, such as a silicon substrate, which can include opposing major surfaces 21 and 22. In other embodiments, bulk substrate 11 can comprise other semiconductor materials, such as heterojunction semiconductor materials, including but not limited to silicon germanium, silicon carbide, gallium nitride, and gallium arsenide. In one embodiment, contact pads 24 can be formed along, in, on, or above portions of major surface 21 to provide for electrical contact between structures formed within substrate 11 and next levels of assembly or external elements. For example, contact pads 24 can be formed to receive bonding wires or clips that may be subsequently be attached to contact pads 24, or contact pads 24 can be formed to receive a solder ball, bump or other type of attachment structure. In other embodiments, contact pads can be directly attached to a next level of assembly in a chip size packaging configuration as illustrated in FIG. 2. Contact pads 24 generally can be a metal or other conductive material. Typically, a dielectric material 26 such as, a blanket deposited dielectric layer can be formed on or overlying major surface 21 to function as a passivation layer for wafer 10. In one embodiment, dielectric material 26 can be a material that etches at a slower rate than that of substrate 11. In one embodiment, dielectric material 26 can be a silicon oxide, silicon nitride, photoresist, or polyimide when substrate 11 is silicon.

In one embodiment, openings can be formed in dielectric material 26 (and other dielectric layers that can be formed underneath dielectric material 26) to expose underlying surfaces of contact pads 24 and surfaces of substrate 11 where singulation lines 13, 15, 17, and 19 are to be formed. In one embodiment, a patterned photoresist layer can be used for the openings using an etching process. In an alternative embodiment, a back layer, such as a back metal layer or a wafer back coating (WBC) can be formed on surface 22 of wafer 10 (not shown).

Figure 5:
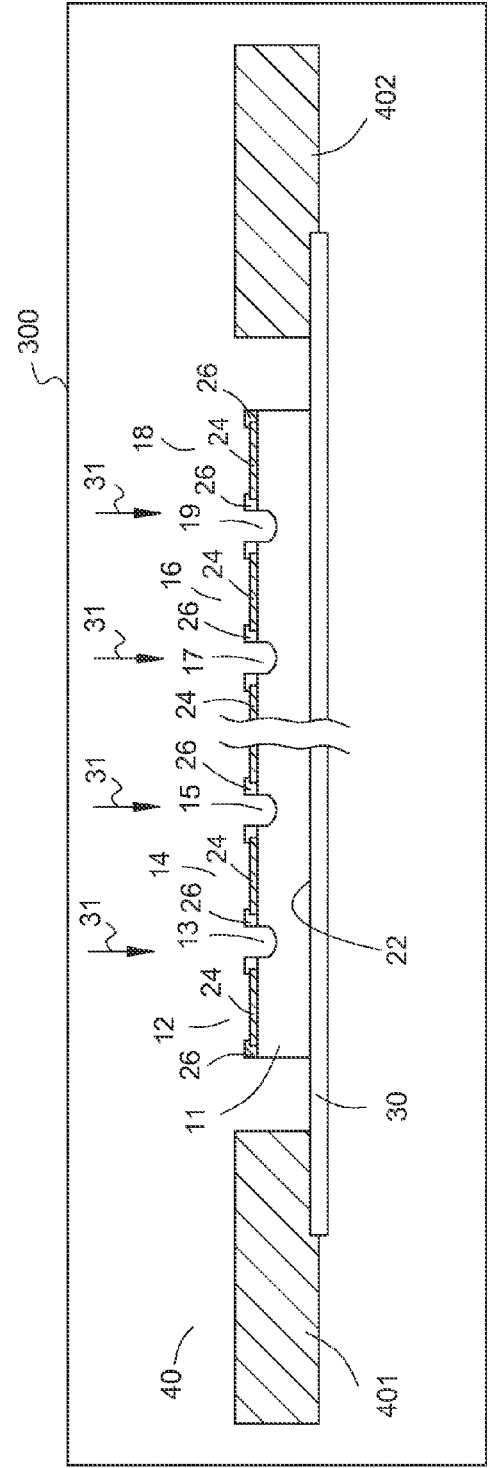

FIG. 5 illustrates an enlarged cross-sectional view of wafer 10 at a subsequent step during a singulation process. In FIG. 5, a plasma or dry etch singulation process is illustrated. In one embodiment, wafer 10 is mounted on carrier tape or film 30 and then can be placed within an etch apparatus 300, such as a plasma etch apparatus. In one embodiment, substrate 11 can be etched through the openings to form or define singulation lines or openings 13, 15, 17, and 19 extending from major surface 21. The etching process can be performed using a chemistry (generally represented as arrows 31) that selectively etches silicon (or other materials that substrate 11 is made of) at a much higher rate than that of dielectrics and/or metals. In one embodiment, wafer 10 can be etched in a fluorinated carbon etch chemistry, such as $CF_4$, with or without oxygen. In another embodiment, wafer 10 can be etched using a process commonly referred to as the Bosch process. In one embodiment, wafer 10 can be etched using the Bosch process in a deep reactive ion etch system. Such etch systems are available from companies, such as Plasma-Therm LLC of St. Petersburg, Fla., U.S.A. In one embodiment, the width of singulation lines 13, 15, 17, and 19 can be from about five microns to about twenty microns. Such a width is sufficient to ensure that the openings that form singulation lines 13, 15, 17, and 19 can be formed completely through substrate 11. In one embodiment, singulation lines 13, 15, 17, and 19 can be formed in about five to about thirty minutes using the Bosch process. In the past, users of the Bosch process completely removed the polymer material at the end of the deep reactive ion etching process because the polymer interfered with subsequent process steps particularly during front-end wafer processing, such as wafer cleans because of the hydrophobicity of the polymer. Thus, one distinction between at least some of the present embodiments is that the polymer formed during the present etching process is not removed at the end and in some embodiments additional polymer is used, and issues associated with the related Bosch process are not an issue with method described herein.

Figure 6:
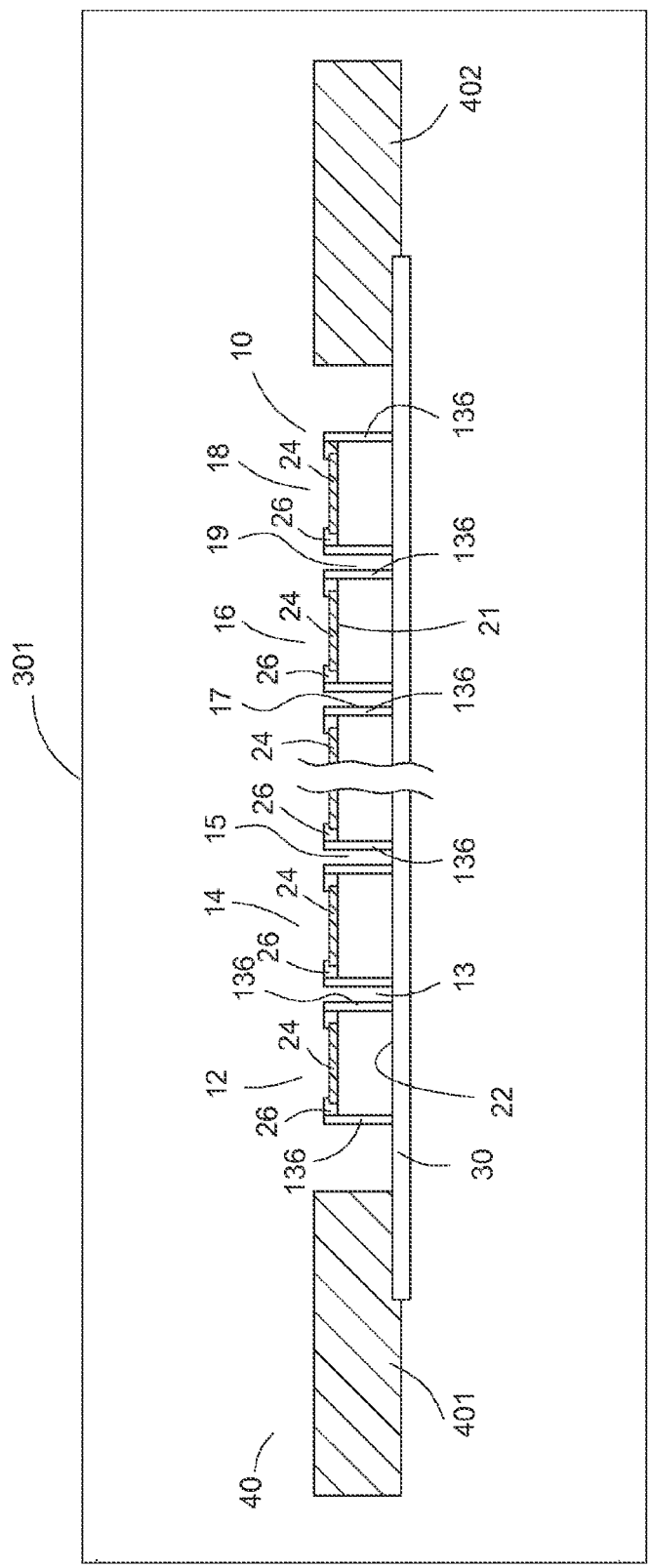

FIG. 6 illustrates a cross-sectional view of wafer 10 at a subsequent process step. In one embodiment, wafer 10 is kept within apparatus 300 for the subsequent process step. In another embodiment, wafer 10 is removed from apparatus 300 and placed into a different or separate apparatus 301, such as a different plasma etch chamber or a low temperature deposition chamber. The different apparatuses can be within the same cluster tool or can be independent process tools. In accordance with the present embodiment, one or more insulating layers 136 are formed along the sidewall surfaces of die 12, 14, 16, and 18. In one embodiment, insulating layers 136 are formed during and/or after the singulation process described previously and can be fluorine containing carbon polymer materials, other polymer materials, dielectric materials, and/or other materials that can formed at low temperatures (i.e., temperatures low enough not to damage carrier tape 30) and that provide isolation of the sidewall surfaces. In accordance with the present embodiment, once insulating layers 136 are formed, a more directional type of dry etch can be used to break-up bonds of the polymer material on the major surface 21 of wafer 10 to make it easier to remove the polymer material from major surface 21 of wafer 10.

Figure 7:
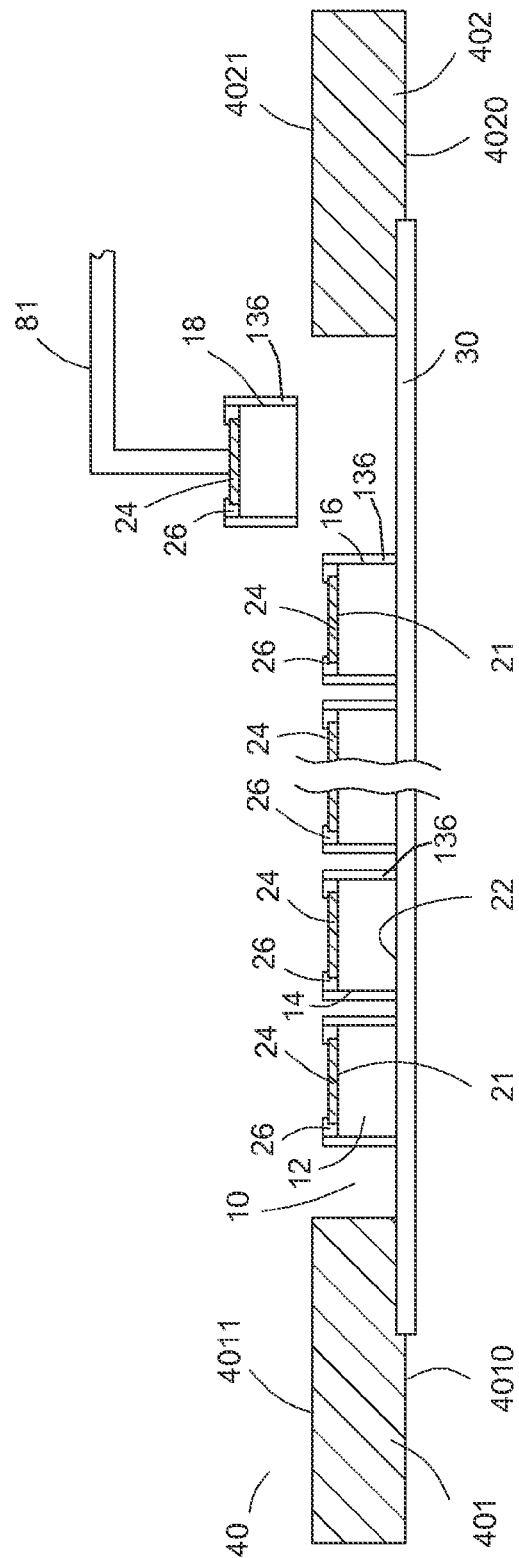
FIG. 7 illustrates a partial cross-sectional view of an embodiment of the wafer of FIG. 6 at a later stage of processing in accordance with an embodiment of the present invention.

In a subsequent step, die 12, 14, 16, and 18 can be removed from carrier tape 30 as part of a further assembly process using, for example, a pick-and-place apparatus 81 as generally illustrated in FIG. 7. In one embodiment, carrier tape 30 can be exposed to a UV light source prior to the pick-and-place step to reduce the adhesiveness of the tape. In other embodiments, another carrier tape can be placed on the surface of wafer 10 opposite to carrier tape 30. Carrier tape 30 can then be removed and the pick-and-place step can be performed, for example, for chip level packaging applications, such as the application illustrated in FIG. 2 where device 100 is placed active surface down onto printed circuit board 201. In other embodiments where wafer 10 includes a back layer, such as a back metal layer or a wafer back coating layer, a separate back layer singulation step can be used to singulate the back metal. An example of such a process is described in U.S. Pat. No. 8,664,089 issued on Mar. 4, 2014, which is hereby incorporated by reference.

From all of the foregoing, one skilled in the art can determine that, according to one embodiment, a method of forming an electronic device (for example, element 100) comprises providing a wafer (for example, element 10) having a plurality of die (for example, element(s) 12, 14, 16, 18, 100) formed on the wafer and separated by spaces. The method includes placing the wafer onto a carrier substrate (for example, element 30. The method includes singulating the wafer through the spaces to form singulation lines (for example, element(s) 13, 15, 17, 19) exposing side surfaces of the die (for example, element 115). The method includes forming an insulating layer (for example, element 136) on the side surfaces.

In another embodiment, singulating the wafer includes plasma etching (for example, element 300) through the spaces to singulate the wafer to provide a plurality of singulated die, and wherein forming the insulating layer comprises forming the insulating layer on the side surfaces of the singulated die while the singulated die are attached to the carrier substrate. In a further embodiment, forming the insulating layer comprises forming the insulating layer having a thickness sufficient to isolate the side surfaces of the singulated die. In a still further embodiment, thickness greater than about 0.1 microns. In another embodiment, forming the insulating layer comprises forming a polymer layer. In a further embodiment, forming the polymer layer comprises forming a fluorinated carbon polymer layer. In a still further embodiment, singulating the wafer and forming the insulating layer are done in different apparatuses (for example, element 300, 301). In another embodiment, singulating the wafer and forming the insulating layer are done in one apparatus (for example, element 300) and the insulating layer is formed at least in part while singulating the wafer. In a further embodiment, forming the insulating layer comprises forming more than one insulating layer, comprising a different material. In a still further embodiment, forming the insulating layer comprises forming a dielectric layer. In another embodiment, forming the dielectric layer comprises forming an oxide layer. In another embodiment, placing the wafer comprises placing the wafer onto a carrier tape attached to a frame.

From all of the foregoing, one skilled in the art can determine that, according to another embodiment, a method of forming an electronic device (for example, element 100) comprises providing a wafer (for example, element 10) having a plurality of die (for example, element(s) 12, 14, 16, 18, 100) formed on the wafer and separated from each other by spaces. The method includes placing the wafer onto a carrier substrate (for example, element 30). The method includes plasma etching (for example, element 300) the wafer through the spaces to form singulation lines (for example, element(s) 13, 15, 17, 19) extending into the wafer to form a plurality of singulated die (for example, element(s) 12, 14, 16, 18, 100). The method includes forming an insulating structure on exposed sidewall surfaces (for example, element 115) of the plurality of singulated die.

In one embodiment of the foregoing method, the method further includes attaching a singulated die (for example, element 100) to a next level of assembly (for example, element 201) in a chip level package configuration. In another embodiment, attaching the singulated die comprises solder attaching the singulated die to the next level of assembly, wherein the insulating structure is configured to protect the exposed sidewall surfaces from solder used in the solder attaching step. In an additional embodiment, forming the insulating structure comprises forming a polymer structure at least 0.1 microns thick. In a further embodiment, forming the insulating structure comprises forming a dielectric structure. In a still further embodiment, placing the wafer onto a carrier substrate comprises placing the wafer onto a carrier tape attached to a frame, and wherein plasma etching the wafer and forming the insulating structure are done in one apparatus (for example, element 300). In another embodiment, placing the wafer onto a carrier substrate comprises placing the wafer onto a carrier tape attached to a frame, and wherein plasma etching the wafer and forming the insulating structure are done in different apparatuses (for example, element(s) 300, 301). In a further embodiment, forming the insulating layer includes forming the insulating layer while plasma etching the wafer and leaving the insulating layer in place after the wafer is singulated. In still further embodiments, additional insulating material can be added to the insulating layer formed during the plasma etch process.

From all of the foregoing, one skilled in the art can determine that, according to an additional embodiment, a semiconductor device (for example, element 100) comprises a region of semiconductor material (for example, element 111) having a first major surface (for example, element 118), a second major surface (for example, element 119), and side surfaces (for example, element 115). The device includes a pair of conductive bumps (for example, element(s) 129, 131) on the first major surface and spaced apart. The device includes an insulating structure (for example, element 136) on the side surfaces; the insulating structure comprising a plasma deposited material having a thickness greater than about 0.1 microns; the semiconductor device configured as a chip level package device.

In view of all of the above, it is evident that a novel method and structure are disclosed. Included, among other features, is placing a wafer onto a carrier tape, and forming singulation lines through the substrate. During and/or after the singulation process, one or more insulating layers are formed or deposited onto sidewall surfaces of the singulated die. The method provides, among other things, an efficient, reliable, and cost effective process for insulating at least sidewall surfaces of singulated die. In particular, the method does not require the use of valuable active area on the die. The insulated die are less susceptible to electrical shorting problems associated with, for example, solder materials used to attach the singulated die to a next level of assembly.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, other forms of removable support materials can be used instead of carrier tapes. Also, the method is applicable to any device where isolation regions are necessary.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

The invention claimed is:

1. A method of forming an electronic device comprising:
providing a wafer having a plurality of die formed as part of the wafer and separated by spaces, wherein the wafer has first and second opposing major surfaces;
placing the wafer onto a carrier substrate;
singulating the wafer through the spaces to form singulation lines exposing side surfaces of the die; and
forming an insulating layer on the side surfaces,
wherein singulating the wafer and forming the insulating layer are done in one apparatus, and wherein the insulating layer is formed at least in part while singulating the wafer.

2. The method of claim 1, wherein singulating the wafer includes plasma etching through the spaces to singulate the wafer to provide a plurality of singulated die, and wherein forming the insulating layer comprises forming the insulating layer on the side surfaces of the singulated die while the singulated die are attached to the carrier substrate.

3. The method of claim 1, wherein forming the insulating layer comprises forming the insulating layer having a thickness sufficient to isolate the side surfaces of the singulated die.

4. The method of claim 3, wherein the thickness is greater than about 0.1 microns.

5. The method of claim 1, wherein forming the insulating layer comprises forming a polymer layer.

6. The method of claim 5, wherein forming the polymer layer comprises forming a fluorinated carbon polymer layer.

7. The method of claim 1, wherein forming the insulating layer comprises forming more than one insulating layer.

8. The method of claim 1, wherein forming the insulating layer comprises forming a dielectric layer.

9. The method of claim 8, wherein forming the dielectric layer comprises forming an oxide layer.

10. The method of claim 1, wherein placing the wafer comprises placing the wafer onto a carrier tape attached to a frame.

11. A method of forming an electronic device comprising:
providing a wafer having a plurality of die formed as part of the wafer and separated from each other by spaces;
placing the wafer onto a carrier substrate;
plasma etching the wafer through the spaces to form singulation lines extending into the wafer to form a plurality of singulated die; and
forming an insulating structure on exposed sidewall surfaces of the plurality of singulated die,
wherein plasma etching the wafer and forming the insulating structure are done in one apparatus.

12. The method of claim 11 further comprising attaching a singulated die to a next level of assembly in a chip level package configuration.

13. The method of claim 12, wherein attaching the singulated die comprises solder attaching the singulated die to the next level of assembly, and wherein the insulating structure is configured to protect the exposed sidewall surfaces from solder used in the solder attaching step.

14. The method of claim 11, wherein forming the insulating structure comprises forming a polymer structure at least 0.1 microns thick.

15. The method of claim 11, wherein forming the insulating structure comprises forming a dielectric structure.

16. The method of claim 11, wherein placing the wafer onto a carrier substrate comprises placing the wafer onto a carrier tape attached to a frame.

17. A method of forming an electronic device comprising:
providing a wafer having a plurality of die formed as part of the wafer and separated from each other by spaces;
placing the wafer onto a carrier substrate;
plasma etching the wafer through the spaces to form singulation lines extending into the wafer to form a plurality of singulated die; and
forming an insulating structure on exposed sidewall surfaces of the plurality of singulated die while the wafer is attached to the carrier substrate,
wherein plasma etching the wafer and forming the insulating structure are done in one apparatus.

18. The method of claim 17 wherein placing the wafer onto the carrier substrate comprises placing the wafer onto a carrier tape attached to a frame.

19. The method of claim 17, wherein
forming the insulating structure comprises forming more than one insulating layer;
a first insulating layer comprises a polymer; and
a second insulating layer comprises an oxide.

20. The method of claim 17 further comprising attaching a singulated die to a next level of assembly in a chip level package configuration.

* * * * *